(12) United States Patent
Schuster-Woldan et al.

(10) Patent No.: US 6,462,980 B2
(45) Date of Patent: Oct. 8, 2002

(54) MRAM MEMORY WITH DRIVE LOGIC ARRANGEMENT

(75) Inventors: Hans Schuster-Woldan, Woerthsee; Siegfried Schwarzl, Neubiberg, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/832,106

(22) Filed: Apr. 11, 2001

(65) Prior Publication Data

US 2001/0035545 A1 Nov. 1, 2001

(30) Foreign Application Priority Data

Apr. 14, 2000 (DE) .......................................... 100 20 128

(51) Int. Cl.⁷ .............................................. G11C 11/00
(52) U.S. Cl. .......................... 365/158; 365/66; 365/171
(58) Field of Search ................................ 365/158, 171, 365/173, 63, 66

(56) References Cited

U.S. PATENT DOCUMENTS 4,605,872 A * 8/1986 Rung ........................... 327/525
5,552,338 A * 9/1996 Kang ........................... 437/170

FOREIGN PATENT DOCUMENTS

| DE | 19807361 | 8/1998 |
| EP | 0959475 | 11/1999 |
| WO | 00/38191 | 6/2000 |

OTHER PUBLICATIONS

English Language Abstract of DE 19807631.

* cited by examiner

*Primary Examiner*—David Nelms
*Assistant Examiner*—Gene N. Auduong
(74) *Attorney, Agent, or Firm*—Greenblum & Bernstein, P.L.C.

(57) ABSTRACT

MRAM memory having a memory cell array (2) comprising magnetoresistive memory components (6a, 6b) arranged in at least one memory cell layer above a semiconductor substrate (4), word lines (7) and bit lines (8, 9) for making contact with the magnetoresistive memory components (6a, 6b) in the memory cell array (2); and having a drive logic arrangement (5a, 5b, 5c) for driving the magnetoresistive memory components (6a, 6b) in the memory cell array (2) via the word and bit lines (7, 8, 9), the drive logic arrangement (5a, 5b, 5c) being integrated below the memory cell array (2) in and on the semiconductor substrate (4).

18 Claims, 4 Drawing Sheets

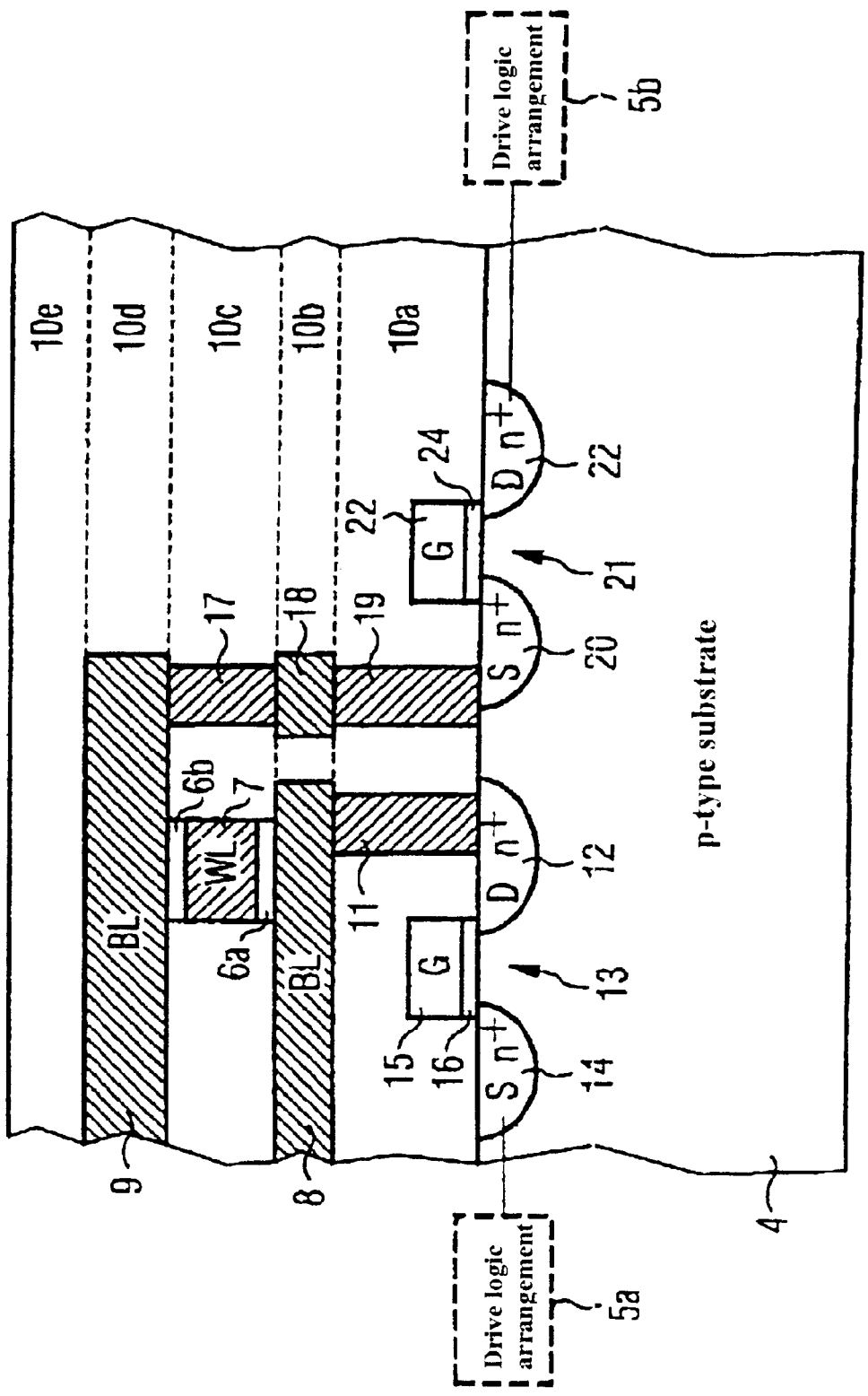

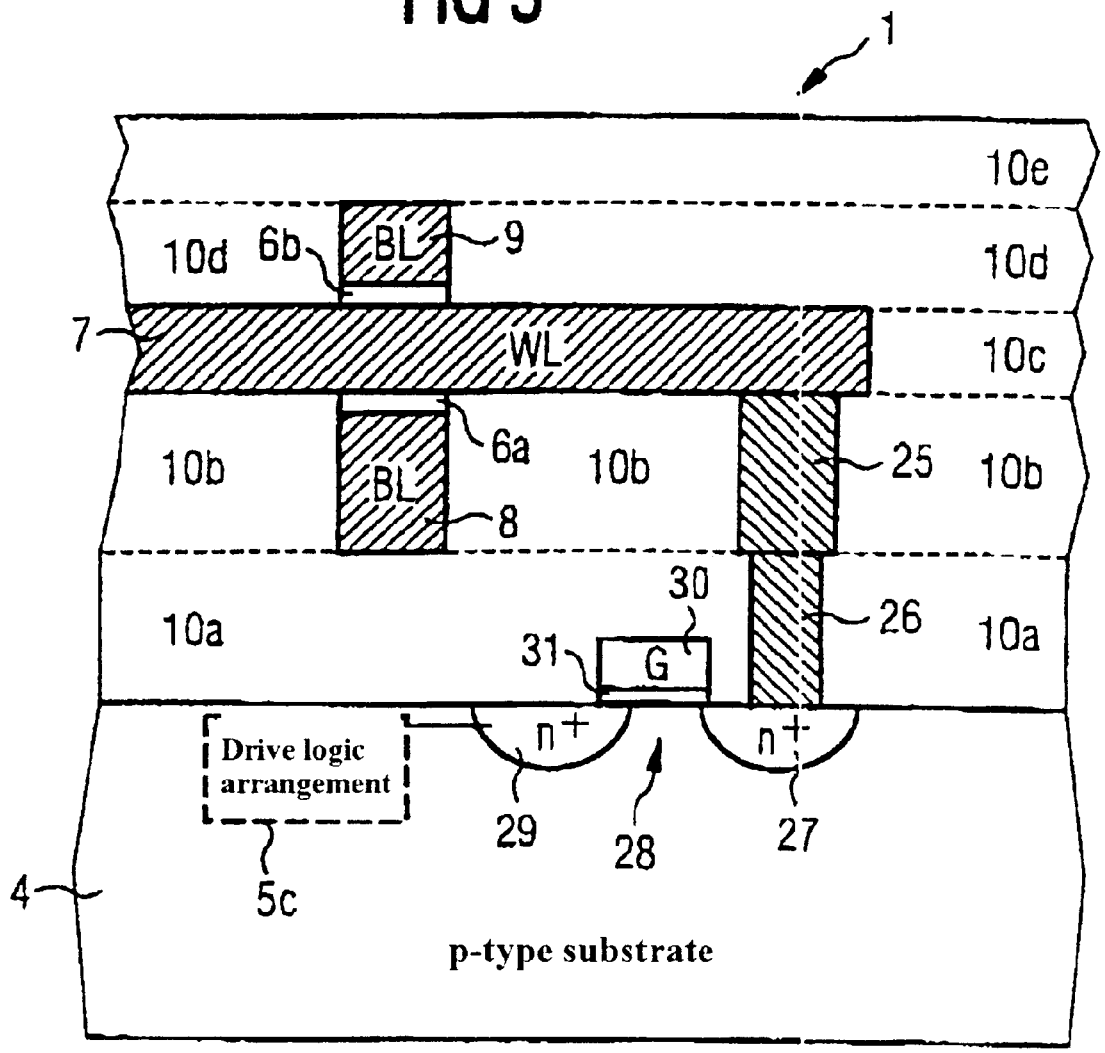

MRAM MEMORY WITH DRIVE LOGIC ARRANGEMENT

The invention relates to an MRAM memory in which the drive logic arrangement for driving the magnetoresistive memory components in a memory cell array of the MRAM memory is integrated below the memory cell array in and on the semiconductor substrate.

MRAM memory components have ferromagnetic layers, the resistance of the memory component depending on the magnetization directions of the ferromagnetic layers. The resistance of the memory component is small in the case of parallel magnetization of the ferromagnetic layers, whereas the resistance of the memory component is large in the case of an antiparallel magnetization of the ferromagnetic layers.

Depending on the construction of the layer structure of the MRAM component, a distinction is made between a GMR memory component, a TMR memory component, an AMR memory component and a CMR memory component.

A GMR memory component has at least two ferromagnetic layers and a nonmagnetic conductive layer arranged in between, the GMR memory component exhibiting a "GMR effect" (GMR: Giant Magneto Resistance), in the case of which the electrical resistance of the GMR memory component depends on whether the magnetizations in the two ferromagnetic layers are oriented in a parallel or antiparallel manner.

A TMR memory component (TMR: Tunneling Magneto Resistance) has at least two ferromagnetic layers and an insulating nonmagnetic layer arranged in between. In this case, the insulating layer is made so thin that a tunneling current occurs between the two ferromagnetic layers. The ferromagnetic layers exhibit a magnetoresistive effect brought about by a spin-polarized tunneling current through the insulating nonmagnetic layer arranged between the two ferromagnetic layers. The electrical resistance of the TMR memory component depends on whether the magnetizations of the two ferromagnetic layers are oriented in a parallel or antiparallel manner.

In the case of the AMR memory component, the resistance of the magnetized conductors is different parallel and perpendicular to the magnetization direction.

In the case of the CMR memory component (CMR= Colossal Magneto Resistance Effect), high coercive forces mean that a high magnetic field is required for changing over between the magnetization states.

FIG. 1 shows a memory cell array of an MRAM memory according to the prior art (e.g. DE 197 44 095), which comprises a multiplicity of metallic write/read lines, also called word and bit lines, which are arranged one above the other in the x- and y-direction, and magnetoresistive memory components which are each connected between two mutually crossing write/read lines and are conductively connected thereto. Signals which are applied to the word lines WL or bit line BL cause magnetic fields as a result of the currents flowing through the word lines WL or bit lines BL, respectively, which magnetic fields, given sufficient strength, influence the memory components situated underneath. In order to write a datum or an information item to a memory component situated at a crossover point between a word line WL and a bit line BL, a signal is applied both to the bit line BL and to the word line WL. The current signals each generate magnetic fields which are superposed and lead to magnetization reversal of the memory component. The mutually crossing word lines WL and bit lines can each be produced with minimal dimensions and distances with a minimal feature size F, resulting in an area requirement of $4F^2$ for each memory component per memory cell layer. MRAM memories can therefore be produced with a very high packing density.

Compared with DRAM memories, these MRAM memories are distinguished by the fact that the individual memory components do not require a selection transistor, but rather are connected directly to the word and bit lines. The memory cell array illustrated in FIG. 1 has just one memory cell layer. In MRAM memories, a plurality of such memory cell layers can be arranged or stacked one above the other. The dimensions of the memory components of the conventional MRAM memories are in a range from 0.05 $\mu$m to 20 $\mu$m. On account of the small size of the memory components, which do not require a selection transistor, and on account of the high possible packing density and also on account of the possible multilayer construction, in MRAM memories a multiplicity of memory components can be integrated within a very small space. The magnetoresistive memory components situated in the memory cell array are driven via a drive logic arrangement.

FIG. 2 shows the construction of an MRAM memory according to the prior art. The memory cell array comprising the magnetoresistive memory components is connected via a contact-making fan-out to the drive logic arrangement, which is arranged around the memory cell array. In the conventional MRAM memory illustrated in FIG. 2, the drive logic arrangement is situated in the periphery of the semiconductor chip and bears on the semiconductor substrate. The drive logic arrangement is connected to the word and bit lines. As can be discerned from FIG. 3, the peripherally arranged drive logic arrangement takes up a large area on the semiconductor substrate. Although the memory cell array constructed from magnetoresistive memory components takes up relatively little space, the conventional MRAM memory illustrated in FIG. 2 overall requires a relatively large area on the semiconductor substrate on account of the peripherally arranged drive logic arrangement.

The object of the present invention, therefore, is to provide an MRAM memory which has a minimal area requirement.

This object is achieved according to the invention by means of an MRAM memory having the features specified in patent claim 1.

The invention provides an MRAM memory having a memory cell array comprising magnetoresistive memory components arranged in at least one memory cell layer above a semiconductor substrate, having word lines and bit lines for making contact with the magnetoresistive memory components in the memory cell array, and having a drive logic arrangement for driving the magnetoresistive memory components in the memory cell array via the word and bit lines, the drive logic arrangement being integrated below the memory cell array in the semiconductor substrate.

In this case, the word and bit lines preferably run essentially perpendicularly to one another.

In a preferred embodiment, the magnetoresistive memory components and the word and bit lines for making contact with the magnetoresistive memory components are embedded in a plurality of dielectric layers.

In this case, the word and bit lines are preferably connected via plated-through holes running through the dielectric layers to the drive logic arrangement integrated in the semiconductor substrate.

In a preferred embodiment, the diameter of the plated-through holes approximately corresponds to the minimum feature size F.

The drive logic arrangement is preferably a CMOS logic arrangement.

In a further preferred embodiment, a memory component in each case has two ferromagnetic layers and a nonmagnetic layer arranged in between.

A memory component of the MRAM memory preferably has two magnetization states.

In a particularly preferred embodiment, the two ferromagnetic layers of the memory component each contain at least one of the elements Fe, Ni, Co, Cr, Mn, Gd, Dy.

The thickness of the ferromagnetic layers of the memory component is preferably less than or equal to 20 nm.

In a further preferred embodiment of the MRAM memory according to the invention, the nonmagnetic layer contains at least one of the materials $Al_2O_3$, NiO, $HfO_2$, $TiO_2$, NbO and $SiO_2$.

In this case, the thickness of the nonmagnetic layer is preferably in a range between 1 and 4 nm.

In a further preferred embodiment, the memory component has an antiferromagnetic layer which is adjacent to one of the ferromagnetic layers and determines the magnetization direction in the adjacent ferromagnetic layer.

In this case, the antiferromagnetic layer preferably contains at least one of the elements Fe, Mn, Ni, Pt, Ir, Tb or O.

In a further preferred embodiment, the dimensions of a memory component are in a range between 0.05 μm and 20 μm.

The bit lines are preferably connected to a sense amplifier, via which the potential on the respective bit line can be regulated to a reference potential and at which an output signal can be picked off.

In this case, the sense amplifier preferably contains a feedback operational amplifier.

In a particularly preferred embodiment, the total thickness of a single-layer memory cell array with the underlying and overlying bit and word lines is between 400 and 1000 nm. Multilayer memory cell arrays with the associated write and read lines are correspondingly multiply thicker.

In a further preferred embodiment of the MRAM memory according to the invention, each word line is in each case connected to two magnetoresistive memory components in two memory cell layers lying one above the other.

This affords the particular advantage that the number of required word lines can be halved.

A preferred embodiment of the MRAM memory according to the invention is described below with reference to the accompanying figures in order to elucidate features that are essential to the invention.

In the figures:

FIG. 4 shows a first sectional view through the MRAM memory according to the invention;

FIG. 5 shows a second sectional view through the MRAM memory according to the invention, the second sectional view running perpendicularly to the first sectional view illustrated in FIG. 4.

Figure 3:
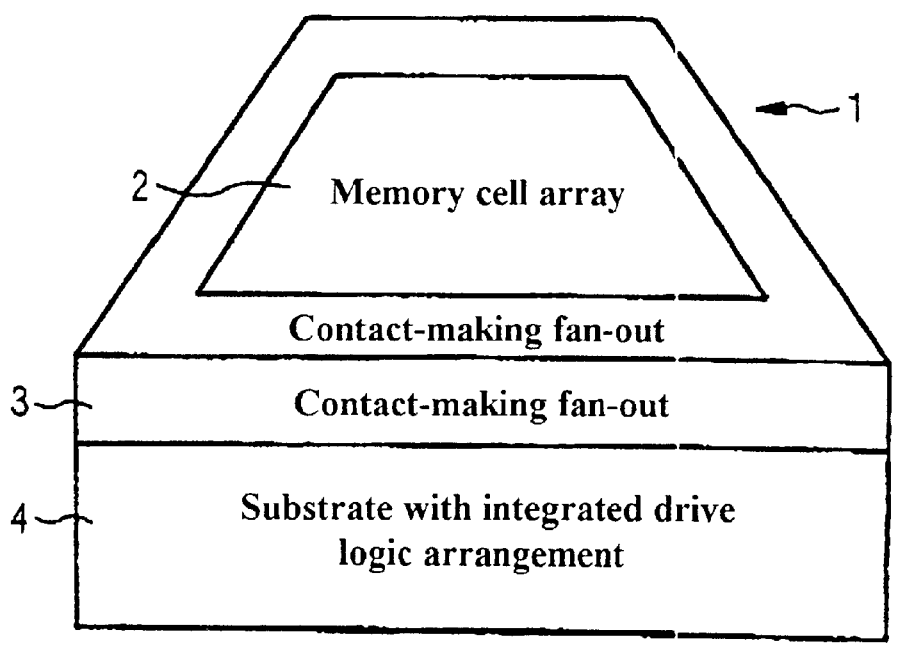
FIG. 3 shows a schematic illustration of the arrangement of the MRAM memory according to the invention.

FIG. 3 shows the spatial construction of an MRAM memory 1 according to the invention. The MRAM memory 1 comprises a memory cell array 2, a contact-making fan-out 3 and also a semiconductor substrate 4 in and on which a drive logic arrangement 5 is integrated. The memory cell array 2 comprises magnetoresistive memory components arranged in a plurality of memory cell layers above the semiconductor substrate 4. Contact is made with the memory components contained in the memory cell array 2 via word and bit lines which run in a lattice-shaped manner and are fanned out in order to make electrical contact with the drive logic arrangement 5 in the contact-making fan-out 3.

Figure 1:
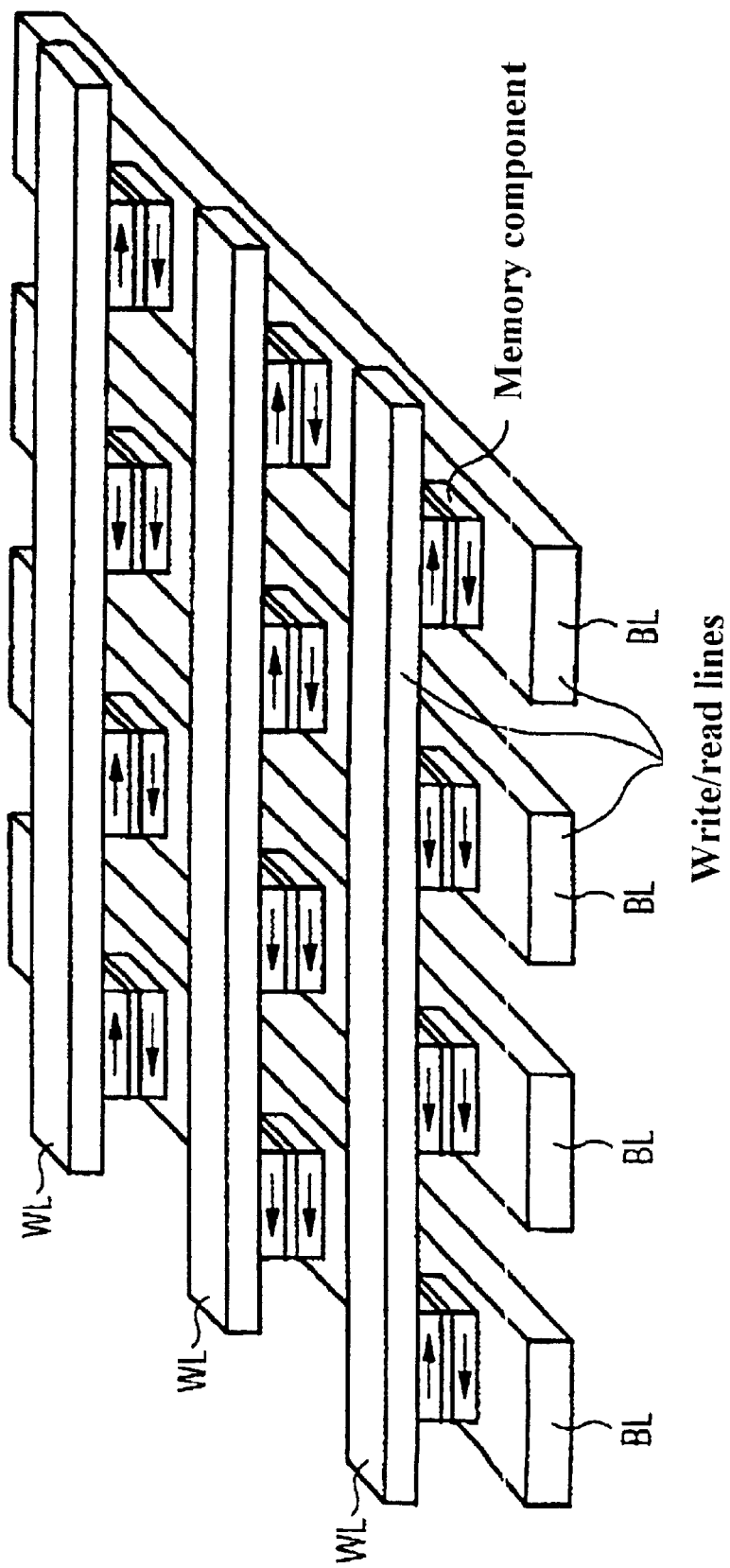
FIG. 1 shows a memory cell array according to the prior art.
Figure 2:
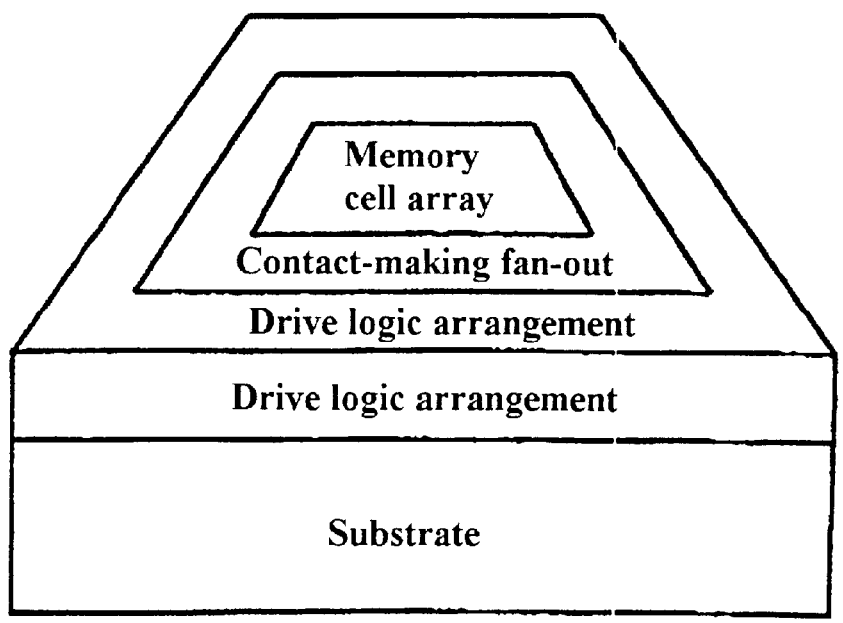
FIG. 2 shows a schematic illustration of the arrangement of a conventional MRAM memory.

As can be gathered from FIG. 3, the drive logic arrangement integrated in the semiconductor substrate 4 is situated below the memory cell array 2 and the contact-making fan-out and not peripherally around the contact-making fan-out 3, as in the conventional spatial arrangement illustrated in FIG. 2. The MRAM memory 1 according to the invention as illustrated in FIG. 3 therefore requires a much smaller area on the semiconductor substrate 4. The saving of area compared with the conventional MRAM memory illustrated in FIG. 2 is up to 50% in the case of the MRAM memory according to the invention as illustrated in FIG. 3.

FIG. 4 shows a first sectional view through the MRAM memory 1 according to the invention.

In the memory arrangement illustrated in FIG. 4, the memory cell array 2 has two memory cell layers with magnetoresistive memory components 6a, 6b. In further embodiments (not illustrated), a multiplicity of memory cell layers can be stacked one above the other.

Contact is made with the magnetoresistive memory components 6a, 6b in the first and second memory cell layers via a common word line 7. The memory component 6a situated in the first memory cell layer is connected to a bit line 8 and the magnetoresistive memory component 6b situated in the second memory cell layer is connected to a bit line 9. The word line 7 and also the two bit lines 8, 9 run essentially perpendicularly to one another. The multiplicity of word lines 7 within the memory cell array 2 run essentially parallel to one another. The multiplicity of bit lines 8, 9 within the first and second memory cell layers also run essentially parallel to one another through the memory cell array 2. The magnetoresistive memory components 6a, 6b and also the word and bit lines 7, 8, 9 for making contact with the magnetoresistive memory components 6a, 6b are embedded in a plurality of dielectric layers 10a, 10b, 10c, 10d, 10e. These dielectric layers are preferably composed of silicon nitride or silicon dioxide. The bit lines 8, 9 and also the word lines 7 are composed of a conductive material, preferably a metal.

As can be gathered from FIG. 4, the bit line 8 of the first memory cell layer is connected via a plated-through hole or a via 11 to an $n^+$-doped drain region of a drive transistor 13. The drive transistor 13 serves for applying a signal to the bit line 8. In addition to the $n^+$-doped drain region, the drive transistor 13 has an $n^+$-doped source region 14, which is electrically connected to a part 5a of the drive logic arrangement 5. The drive transistor 13 furthermore has a gate terminal 15, which is isolated from the P-doped semiconductor substrate 4 by a gate oxide 16.

The bit line 9 of the second memory cell layer for making contact with the memory component 6b is connected via a plated-through hole 17 to a metalization layer 18, which is embedded in the dielectric layer 10b and, for its part, is connected via a plated-through hole 19 to an $n^+$-doped source region 20 of a drive transistor 21. In addition to the $n^+$-doped source terminal region 20, the drive transistor 21 has an n-doped drain terminal region 22. The drain terminal region 22 is connected to a part 5b of the drive logic arrangement 5. The drive transistor 21 furthermore has a gate terminal 23, which is isolated from the p-doped semiconductor substrate 4 by a gate oxide 24. The drive transistor 21 enables a signal to be applied to the bit line 9 of the second memory cell layer within the memory cell array 2.

The selection transistors 13, 21 illustrated in FIG. 4 are N-channel MOSFETs embedded in a p-doped semiconductor substrate 4. In an alternative embodiment, it is also possible to use P-channel MOSFETs as selection transistors which are embedded in an n-doped semiconductor substrate 4. If a CMOS logic arrangement is used, both N-channel and P-channel MOSFETs are used. In a further alternative embodiment, the selection transistors 13, 21 may also be formed by bipolar transistors.

The plated-through holes 11, 17, 19 are composed of a conductive material, such as, for example, tungsten or copper. They are preferably produced in a damascene process. In this case, the diameter of the plated-through holes 11, 17, 19 is preferably exactly the same size as the minimal feature size F, the minimal lithographic feature size being approximately in the region of 100 nm. The lateral dimensions of the magnetoresistive memory components 6a, 6b are preferably likewise in the size region of F, while their thicknesses are between 20 and 40 nm. The total thickness of a two-layer memory cell array is preferably in a range between 600 and 1500 nm. Memory cell arrays having further memory cell layers are correspondingly thicker. A silicon substrate or GaS substrate may be used as the semiconductor substrate 4. As can be gathered from FIG. 4, the drive logic arrangement 5 is integrated in the semiconductor substrate 4 and connected via the two control transistors 13, 22 to the bit lines 8, 9 for driving the memory components 6a, 6b. The drive logic arrangement 5, whose circuit parts 5a, 5b are indicated by broken lines in FIG. 4, is situated below the memory cell array 2. In this case, the drive logic arrangement 5 is preferably constructed as a CMOS logic arrangement.

FIG. 5 shows a further sectional view through the MRAM memory 3 according to the invention (the sectional view illustrated in FIG. 5 running perpendicularly to the sectional view illustrated in FIG. 4).

The word line 7 for making contact with the memory components 6a, 6b is connected to an n$^+$-doped source terminal region 27 of a further drive transistor 28 via a metalization layer 25, which is embedded in the dielectric layer 10b, and via a plated-through hole 26 through the dielectric layer 10a. The drive transistor 28 has an n$^+$-doped drain terminal region 29, which is electrically connected to a circuit part 5c of the drive logic arrangement 5. The drive transistor 28 has a gate terminal 30, which is isolated from the p-doped semiconductor substrate 4 by a gate oxide 31. Via the drive transistor 28 and the word line 7, the drive logic arrangement 5 controls the magnetoresistive memory components 6a, 6b situated in the memory cell layers. In this case, the word line 7 simultaneously serves for driving the memory components 6a in the first memory cell layer and the memory components 6b in the second memory cell layer.

The memory components 6a, 6b have two ferromagnetic layers and a nonmagnetic layer arranged in between. In this case, the memory components 6a, 6b can be switched between two magnetization states. The ferromagnetic layers provided in the memory components 6a, 6b contain at least one of the elements Fe, Ni, Co, Cr, Mn, Gd, Dy. In this case, the thickness of the ferromagnetic layers is below 20 nm. The nonmagnetic layer contained in the memory components 6a, 6b is preferably composed of $Al_2O_3$, NiO, $HfO_2$, $TiO_2$, NbO, $SiO_2$, and has a thickness in a range between 1 and 4 nm. In addition, the memory components 6a, 6b contain an antiferromagnetic layer which lies parallel to one of the ferromagnetic layers, makes contact therewith and fixes the magnetization direction in this ferromagnetic layer. In this case, the antiferromagnetic layer of the memory components 6a, 6b contains at least one of the elements Fe, Mn, Pt, Ni, Ir, Tb or O.

In order to write an information item to a memory component 6a, 6b, a current $I_{WL}$ is impressed into the associated word line 7 and a current $I_{BL}$ is impressed into the associated bit lines 8, 9 by the drive logic arrangement 5. These currents induce a magnetic field $H_{WL}$ around the word line 7 and a magnetic field $H_{BL}$ around the associated bit line 8, 9. In the crossover region between bit line 8, 9 and the word line 7, the resulting magnetic field is large enough to influence the magnetization of one of the two ferromagnetic layers. The magnetization of the other ferromagnetic layer is fixed by the antiferromagnetic layer adjacent to the second ferromagnetic layer.

In order to read an information item from a memory component 6a, 6b, all methods can be used which are possible for conventional MRAM memories with a peripheral drive logic arrangement.

In the case of the magnetoresistive MRAM memory 1 according to the invention, a multiplicity of memory cell layers can be stacked one above the other on the semiconductor substrate 4. Each memory cell layer contains a multiplicity of magnetoresistive memory components 6a, 6b which are driven via word lines and bit lines, the word and bit lines running essentially perpendicularly to one another. In this case, the memory components 6a, 6b have very small dimensions in a range between 0.5 and 20 μm because the magnetoresistive memory components, in contrast to DRAM memory cells, do not require their own integrated selection transistor. The small size of a memory component enables an extremely high packing density within the memory cell array 2 of the MRAM memory 1 according to the invention. In the case of the MRAM memory 1 according to the invention, the drive logic arrangement 5 is not arranged at the periphery, but rather below the memory cell array 2. In this case, the drive logic arrangement 5 is connected to the word and bit lines 7, 8, 9 by drive transistors and plated-through holes and is integrated in the semiconductor substrate 4 of the MRAM memory 1. This results in a further reduction in the size of the MRAM memory. The MRAM memory 1 according to the invention therefore has an extremely high storage capacity in conjunction with minimal area occupation on the semiconductor substrate 4.

The saving of area in the MRAM memory 1 according to the invention means that the production costs can be greatly reduced. Moreover, the signal paths are shortened, as a result of which the MRAM memory according to the invention operates faster. The electrical connections—illustrated in FIGS. 4, 5—between the drive logic arrangement 5 via the drive transistors 13, 21, 28 to the word and bit lines 7, 8, 9 do not have to be arranged at the edge of the memory cell array 2 and below the same, but rather, in further embodiments, are also situated within or centrally below the memory cell array 2. This makes it possible to further shorten the signal propagation times to the memory components 6a, 6b within the memory cell array 2. Therefore, in comparison with a conventional MRAM memory, the MRAM memory 1 according to the invention is distinguished by particularly short signal propagation limes and hence short memory access times.

The present disclosure relates to subject matter contained in priority German Patent Application No. 100 20 128.8, filed on Apr. 14, 2000, the contents of which is herein expressly incorporated by reference in its entirety.

What is claimed is:

1. An MRAM memory comprising:
   (a) a memory cell array having magnetoresistive memory components arranged in at least one memory cell layer above a semiconductor substrate;
   (b) a fan-out apparatus comprising word lines and bit lines for making contact with the magnetoresistive memory components in the memory cell array; and having
   (c) a drive logic arrangement for driving the magnetoresistive memory components in the memory cell array via the word and bit lines, the drive logic arrangement being integrated below the memory cell array and the fan-out apparatus in and on the semiconductor substrate.

2. The MRAM memory as claimed in claim 1, wherein the word lines and bit lines run essentially perpendicularly to one another.

3. The MRAM memory as claimed in claim 1, wherein the magnetoresistive memory components and the word and bit lines for making contact with the magnetoresistive memory components are embedded in a plurality of dielectric layers.

4. The MRAM memory as claimed in claim 1, wherein the word and bit lines are connected via plated-through holes through the dielectric layers to the drive logic arrangement integrated in the semiconductor substrate.

5. The MRAM memory as claimed in claim 1, wherein the diameters of the plated-through holes approximately correspond to the minimum feature size F.

6. The MRAM memory as claimed in claim 1, wherein the drive logic arrangement is a CMOS logic arrangement.

7. The MRAM memory as claimed in claim 1, wherein the memory components each have two ferromagnetic layers and a nonmagnetic layer arranged in between.

8. The MRAM memory as claimed in claim 7, wherein the two ferromagnetic layers each contain at least one of the elements Fe, Ni, Co, Cr, Mn, Gd, Dy.

9. The MRAM memory as claimed in claim 7, wherein the two ferromagnetic layers have a thickness which is less than or equal to 20 nm.

10. The MRAM memory as claimed in claim 7, wherein the nonmagnetic layer contains at least one of the materials A1203, NiO, FhO2, TiO2, NbO, SiO2.

11. The MRAM memory as claimed in claim 7, wherein the nonmagnetic layer of a memory component has a thickness in the range between 1 and 4 nm.

12. The MRAM memory as claimed in claim 7, wherein the memory components have an antiferromagnetic layer adjacent to one of the ferromagnetic layers.

13. The MRAM memory as claimed in claim 12, wherein the antiferromagnetic layer contains at least one of the elements Fe, Mn, Pt, Ni, Ir, Tb or 0.

14. The MRAM memory as claimed in claim 1, wherein the memory components each have two magnetization states.

15. The MRAM memory as claimed in claim 1, wherein the memory components have dimensions in a range between 0.5 $\mu$m and 20 $\mu$m.

16. The MRAM memory as claimed in claim 1, wherein the bit lines are each connected to a sense amplifier.

17. The MRAM memory as claimed in claim 1, wherein the total thickness of the memory cell layers lying one above the other is between 400 and 1000 nm.

18. The MRAM memory as claimed in claim 1, wherein the word lines are each connected to memory components in two memory cell layers lying one above the other.

* * * * *